United States Patent [19]

Adamski et al.

[11] Patent Number: 4,963,714
[45] Date of Patent: Oct. 16, 1990

[54] DIODE LASER SOLDERING SYSTEM

[75] Inventors: Joseph R. Adamski, Sudbury; Christopher Ferguson, Framingham; William E. Prifti, Milton; William E. Nothe, Billerica, all of Mass.

[73] Assignee: Raytheon Company, Lexington, Mass.

[21] Appl. No.: 261,064

[22] Filed: Oct. 24, 1988

[51] Int. Cl.[5] ............................................. B23K 26/00
[52] U.S. Cl. ........................... 219/121.63; 219/121.64; 219/121.76
[58] Field of Search ...................... 219/121.63, 121.64, 219/121.6, 121.85, 121.76; 372/38, 75

[56] References Cited

U.S. PATENT DOCUMENTS

| 3,229,095 | 1/1966 | Lasher et al. | 219/121.76 |
| 3,383,491 | 5/1968 | Muncheryan | 219/121.63 |
| 4,327,277 | 4/1982 | Daly | 219/121.64 |
| 4,472,797 | 9/1984 | Nicia | 370/1 |
| 4,535,219 | 8/1985 | Sliwa, Jr. | 219/121.64 X |
| 4,868,612 | 9/1989 | Oshima et al. | 357/4 |

OTHER PUBLICATIONS

"Diode-Pumped Nd:YAG Uses Fiber Bundle", Laser Focus/Electro-Optics, May 1988, pp. 28-29.
"Lasers Mesh New and Old Media", Electronic Engineering Times, May 1988, p. 103.
"Fiber-Optic Laser Welder", Popular Science, p. 18, date unknown.
"Semiconductor Laser Oscillator-SCL-18", Sony Corporation, date unknown.
Dempa Digest, Aug. 1, 1988, p. 6.
Comline Electronics, Oct. 26, 1987, p. 6.

Primary Examiner—C. L. Albritton
Attorney, Agent, or Firm—Steven C. Stewart; William R. Clark; Richard M. Sharkansky

[57] ABSTRACT

A laser soldering system wherein a plurality of laser beams are simultaneously directed to a plurality of spatially separate locations on a printed circuit board for simultaneously soldering. Each of the laser beams is formed by combining the outputs of a plurality of fiber cables, each of which is connected to an individual laser diode.

15 Claims, 2 Drawing Sheets

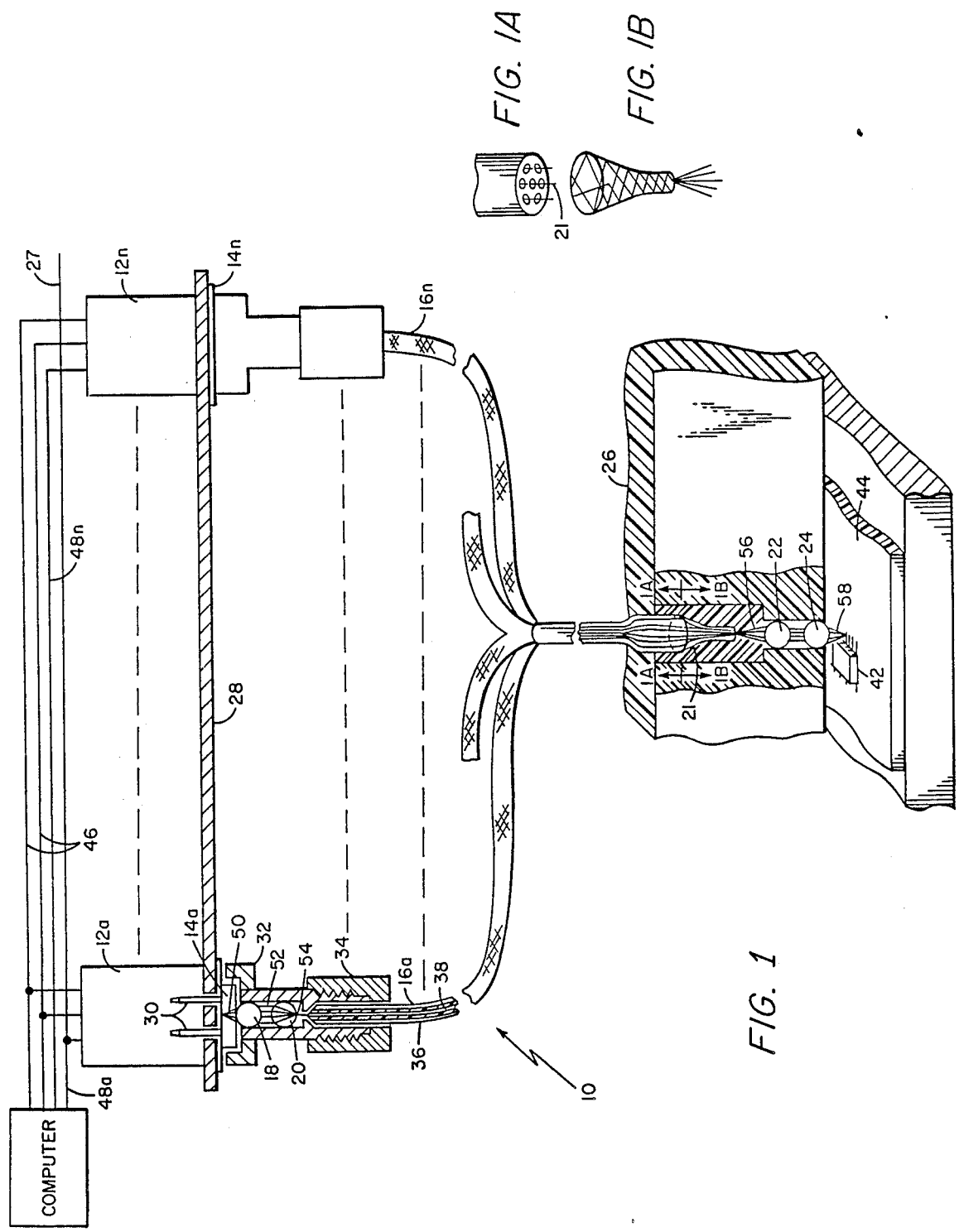
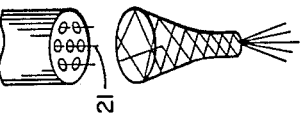
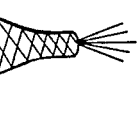
FIG. 1A
FIG. 1B
FIG. 1

DIODE LASER SOLDERING SYSTEM

Background of the Invention

The field of the invention generally relates to diode laser soldering systems that combine laser light from a plurality of laser sources to generate a higher intensity laser beam to melt materials that are used to connect integrated circuit packages to a printed circuit board. More particularly, this invention relates to a diode laser soldering system that can simultaneously melt solder at different locations on a printed circuit board.

As is known in the electronics industry, electronic circuits are formed by placing integrated circuits (IC's) on printed circuit boards. During manufacture, the IC packages are inserted onto the printed circuit board, with the leads extending through eyelets in the board. Next, the board is passed though a wave solder machine that applies a thin layer of molten solder to the lead projection regions on the bottom of the printed circuit board.

With the advent of surface mount components, IC packages are mounted on both sides of a circuit board. With such arrangement, a wave solder machine may not be practical to use because the wave solder machine could damage components.

One method surface mount IC's are being soldered to the printed circuit boards is by hand. A printed circuit board that is to hold surface mount components is constructed with solder attached to the location where the IC lead is to be placed. The integrated circuit packages are then attached to the printed circuit board. A technician then applies heat to the lead of the IC component with a soldering iron. The soldering iron then causes the lead to heat up and melt the pre-deposited solder onto the IC leads. Hand construction of surface mount components has drawbacks, as the technician may apply heat to the lead too long, which can cause damage to the integrated circuit. Further, the technician may not apply the soldering iron to the integrated circuit lead long enough, which results in a cold solder joint and an unreliable connection. Another drawback to using the soldering iron is that the operator may apply the solder iron to the wrong location on the printed circuit board, thereby damaging the board.

Another method of soldering surface mount components to a printed circuit board is by using a laser system. Current laser systems use a mirror and a glass lens to focus a beam of a YAG laser onto the IC lead location on the printed circuit board where the solder is to be melted. The laser is applied to that point for a period of 0.5 to 1.0 seconds to heat the IC lead, resulting in the IC component being soldered to the board. When another location is to be soldered, the mirror rotates slightly, which directs the laser beam to another location. One drawback to this system is that the laser only solders one or two locations at a time (see U.S. Pat. No. 4,327,277), resulting in a lengthy amount of time to solder a complete printed circuit board. An additional drawback of the YAG laser is that it is expensive to construct. Another drawback of the YAG laser system is that the laser's associated reflecting and focusing glass requires a great deal of space, thereby preventing a multiplicity of laser sources.

Laser diodes have been used for generating lasers light; however, a laser diode radiates a single beam having a small amount of laser light, thereby making it difficult to use laser diodes when heating materials. Further, individual laser diodes are too large to allow a multiplicity of diodes to join together to combine their light. Accordingly, laser diodes have not been used to melt solder.

SUMMARY OF THE INVENTION

It is an object of this invention to provide an improved soldering system.

It is another object of this invention to provide an apparatus that combines light from a plurality of sources and maintains the original intensity of the light.

It is a object of this invention to provide a soldering system that simultaneously melts different points on a printed circuit board at the same time.

It is also an object of this invention to provide an improved apparatus for soldering components to surface mount printed circuit board.

These and other objects of the invention are obtained generally by providing an apparatus for directing laser light at an electronic circuit, where the apparatus comprises means for generating a plurality of laser light beams and means optically coupled to the generating means for combining the laser light to form a single laser beam and for directing the single laser beams onto the electronic circuit. It may be preferable that the generating means comprises a plurality of laser diodes. It may also be preferable that the combining means comprises a plurality of fiber optic cables which are bundled together at one end adjacent the circuit. It may additionally be preferable that the apparatus comprise means for focusing the laser light from the generating means into the combining means.

The invention may be further practiced by an apparatus for reflowing solder contacting an integrated circuit lead to connect the integrated circuit lead to a printed circuit board comprising means for generating a plurality of laser light beams, a plurality of fiber optic cables having an input end and an output end where said input end is optically coupled to the generating means to allow light from the generating means to propagate through the cables and having the output end of the cables being bundled together. Homogenizer means optically coupled to the output end for combining the propagated light, within the fiber optic cables, so as to form a single laser light beam, and means for directing the single laser light beam from the homogenizer onto the integrated circuit lead so as to heat the lead, thereby reflowing the solder. It may be preferable that the apparatus further comprise means for enabling and disabling the generating means, and means for moving the circuit board so that the combined laser light beam can reflow another solder location on the printed circuit board.

The invention may also be practiced by an apparatus for melting solder, contacting an integrated circuit lead to connect the integrated circuit lead to a printed circuit board, where the apparatus comprises a plurality of laser diodes generating laser light, a plurality of fiber optic cables, each fiber cable having one end optically coupled to the laser diode, and the opposite end bundled together with the fiber cables such that the output from the bundle forms a plurality of closely spaced beams. A homogenizer means is connected to the bundled end of the fiber optic cables for combining said plurality of light beams to form a single laser beam. Also provided is means for focusing the single laser beam on the integrated circuit so as to heat the lead, thereby melting the solder.

The invention may additionally be practiced by a system for melting solder contacting an integrated circuit lead to connect the integrated circuit lead to a printed circuit board comprising means for generating a plurality of focused light beams to simultaneously melt solder located at a plurality of locations on the circuit board, where the generating means comprises a plurality of laser diodes generating laser light, a plurality of fiber optic cable, each fiber optic cable having one end optically coupled to the laser diode so as to propagate the light through said cables and the opposite end of the fiber cables being bundled together with the other fiber optic cables, means for combining the light output from the plurality of fiber optic cables to form a single laser beam, means for focusing the single laser light beam on the integrated circuit lead so as to heat the lead, thereby reflowing solder. Also provided is means for moving the circuit board so that the focused beams can heat another location on the circuit board.

It may be preferable that the invention further be practiced by a method of soldering an electronic chip lead having solder under the lead on a printed circuit board substrate, comprising the steps of generating a laser light beam from a diode laser, optically coupling the laser light beam into a fiber optic cable, forming a laser light beam from the light output of the fiber optic cable, and focusing the formed laser light beam on the electronic chip lead so as to heat the lead, thereby melting solder.

BRIEF DESCRIPTION OF THE DRAWINGS

FIG. 1 is a perspective view of multi-branch fiber optic bundle having an array of fiber optic elements combining out from an array of laser diodes; and FIG. 1A is a cross sectional view of FIG. 1 along line 1A-1A and FIG. 1B is a cross sectional view of FIG. 1 along line 1B-1B.

DESCRIPTION OF THE PREFERRED EMBODIMENTS

Figure 2:
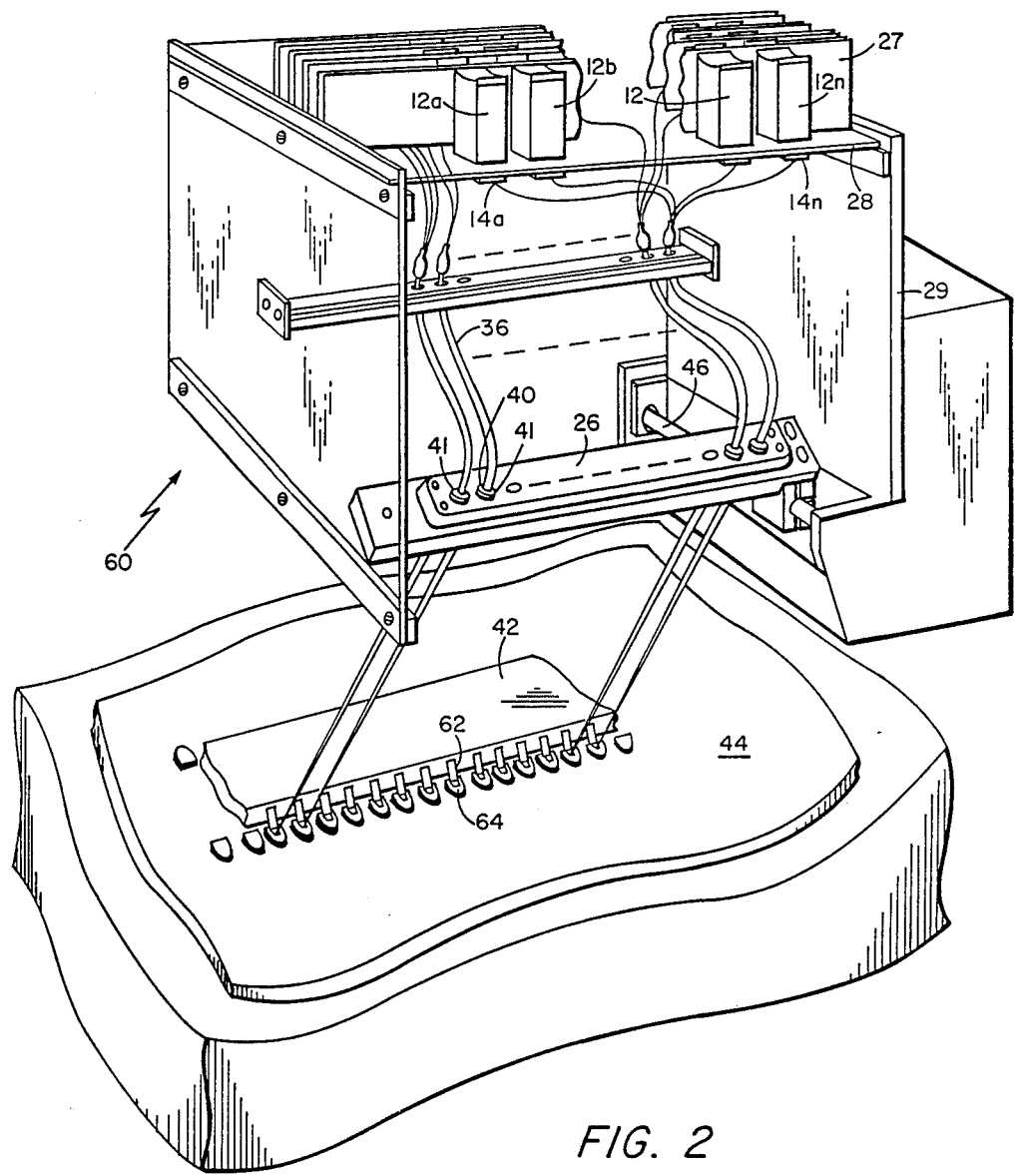
FIG. 2 is a perspective view of the soldering system having a plurality of fiber optic bundles, as shown in FIG. 1, operating on a printed circuit board.

Referring to FIG. 1, there is shown a laser diode soldering system 10 including power supplies 12(a-n) and laser diode 14 being optically coupled to a fiber optic cables 16(a-n). An exemplary laser diodes 14(a-n) is Sld 304, manufactured by Sony Corporation. One end of the fiber optic cable 16 is optically coupled to each one of the laser diodes 14 through a series of optic focusing lenses 18 and 20. The other end of the fiber optic cable 16a is optically coupled to a homogenizer 21 and a series of PCB focusing lenses 22 and 24 which are mounted in a fiber jig 26.

The power supplies 12(a-n) are held in place with a power supply mounting plate 27. The power supplies 12(a-n) are supported by a cooling plate 28. Protruding through the cooling plate 28 and connected to power supplies 12(a-n) are laser diode leads 30.

Mounted below the laser diode 14a is an optic focusing element holder 32 which holds optic focusing lenses 18 and 20. Optic focusing lenses 18 and 20 include a first optic focusing lens 18 and second optic focusing lens 20 for focusing the laser diode 14a into fiber optic cable 16. Each lens is approximately 2 mm in diameter. The fiber optic cable 16 is connected to the optic focusing element holder 32 through an optic connector 34.

The fiber optic cable 16a includes a shell 36 and a fiber optic strand 38. The fiber optic cable 16a is connected to the optic focusing element holder 32 at one end and a fiber optic combiner 40 at the other end. The fiber optic combiner 40 bunches the fiber optic strands 38 disposed within a plurality of fiber optic cables 16(a-n) to form a single fiber optic bundle 41.

The homogenizer 21 is constructed by stretching silicon or glass to form an object as shown in FIG. 1. The preferable dimensions are 2.5 inches long by 0.160 inches in diameter on the wide end and 0.004 inches in diameter on the small end. The dimensions listed for homogenizer 21 are only suggested; however, any dimension would be accepted as long as the wide diameter dimension can encompass the light output from the fiber strands and the small diameter dimension permit the PCB focal lens 22 and 24 to focus the homogenizer 21 output laser light. It is also preferable that the homogenizer 21 butt up against the fiber optic strands. The homogenizer 21 combines a plurality of light outputs from fiber optic strands 38 within fiber optic bundle 81 and converts the combined light into a single laser beam that has enough intensity to reflow solder.

The fiber optic combiner 40 is inserted into the fiber jig 26. Also disposed in the fiber jig 26 is homogenizer 21, a first PCB focusing lens 22 and a second PCB focusing lens 24. Disposed below the fiber jig 26 is integrated circuit package 42 mounted on a printed circuit board 44. The first PCB focusing lens 22 and the second PCB focusing lens 24 focuses the laser light output from homogenizer 21 and direct that light onto the printed circuit board 44.

Connected to the power supplies 12(a-n) are power lines 46 and on/off control lines 48a-48n. The on/off control lines 48a-48n are connected to an external computer 49 to selectively turn on and turn off each power supply 12(a-n).

During operation, the external computer turns on power supply 12(a-n) which enables laser diode 14(a-n). Laser diode 14a then generates a dispersing beam 50 of 1.06 microns of laser light which is then focused by first optic focusing lens 18. The focused beam 52 is then directed at fiber optic cable 16 by second optic focusing lens 20. The directed laser beam 54 is then propagated through fiber optic cable 16a along with directed laser beams from fiber optic cables 16b-16n toward the fiber jig 26. The light beam output 56 from the fiber optic bundle 41 is combined by homogenizer 21, focused by first PCB focusing lens 22 and then (light 58) directed by second PCB focusing lens 24 at integrated circuit package 42 on printed circuit board 44.

By using the fiber optic combiner 40 with homogenizer 21 to direct a multiplicity of fiber optic strands 38 at a first and second PCB focusing lens 22 and 24, laser diodes 14 can be used to solder integrated circuit packages 42 to printed circuit boards 44. Further, by using laser diodes 14 in combination with a plurality of fiber optic cables 16 connect to combiner 40, and homogenizer 21, the magnitude of a laser diode 14 output energy (typically 0.5 to 1.0 watts) is magnified by an amount proportional to the number of laser diodes used. Ideally, enough laser diodes to generate 4 to 8 watts should be used to melt solder.

Referring to FIG. 2, there is shown a diode laser soldering system 60 using a multiplicity of fiber bundles 41. This system has the power supplies 12(a-n), laser diodes 14(a-n), fiber bundles 41, jig 26 and printed circuit board 44, as shown in FIG. 1. Further, in this diode laser soldering system 60, a multiplicity of fiber bundles 41 are used to simultaneously solder multiple locations on the printed circuit board 44.

The power supplies 12(a–n) shown are mounted on a power supply mounting plate 27 and cooling plate 28, as shown in FIG. 1. Cooling plate 28 is mounted on support structure 29. Flowing between the power supply mounting plate 26 is a cool liquid (not shown) to provide a means for cooling the power supply 12(a–n) and laser diodes 14(a–n). The cooling plate 28 is kept at a cool temperature to increase the reliability and life expectancy of the laser diodes 14(a–n). Each of the power supplies 12(a–n) are individually controlled by an external computer.

The fiber optic combiners 40 are positioned in a single row in fiber jig 26. The spacing between fiber optic combiners 40 in fiber jig 26 is typically 50 to 100 mills.

There is shown in FIG. 2 is a single jig 26; however, a multiple number of jigs may be used. Ideally, two opposing jigs will be used which will be positioned to simultaneously heat solder on opposing sides of integrated circuit package. Further, the jig 26 may be positioned on a bar 46 that allows the jig 26 to be finely adjusted to solder a variety of integrated circuit package shapes.

Printed circuit board 44 is mounted on a piece of positioning equipment (not shown) such as Asymteck, Automove 300System. This positioning equipment is electrically connected to an external computer 49 which changes the position of printed circuit board 44 to solder other locations.

Resting on top of printed circuit board 44 are integrated circuit packages 42 that have leads 62 along their outer edges which become soldered to printed circuit board 44. The leads 62 are typically spaced 0.01 to 0.05 inches apart for surface mount packages. Constructed with printed circuit board 44 under leads 62 is a small amount of solder 64 which adheres leads 62 to printed circuit board 44 when lead 62 is heated.

During operation, printed circuit board 44 is positioned at a location where the laser light from the fiber optic bundles 41 will heat lead 62. The power supply 12 is then preferably enabled for a 0.75 to 1.25 second interval by the external computer which energizes various sets of laser diodes 14. The laser light then propagates throughout the various fiber bundles, homogenizer 21, and is directed by PCB focusing lenses 22 and 24 within jig 26, thereby simultaneously heating different leads 62 of the integrated circuit packages 42. Accordingly, a multiplicity of locations on the integrated circuit package leads are simultaneously soldered.

The external computer, after soldering a first set of leads 62, will move the printed circuit board 44 in an X and/or Y direction to heat a second set of leads 62. Thus, by having a multiplicity of laser diodes 14 turned on simultaneously and combining the laser light output of those laser diodes 14(a–n) along with other sets of combined laser light from other laser diodes, a multiplicity of leads on an integrated circuit package 44 can be simultaneously heated. Further, simultaneously heating different leads on an IC package 42 located on a printed circuit board 44 will substantially speed up the soldering process.

This concludes the Description of the Preferred Embodiments. A reading of those skilled in the art will bring to mind many modifications and alternatives without departing from the spirit and scope of the invention. Accordingly, it is intended that the invention only be limited by the following claims.

What is claimed is:

1. An apparatus for directing laser light to provide laser soldering on an electronic circuit, said apparatus comprising:
    means, comprising a plurality of laser diodes for generating a plurality of laser light beams; and
    means optically coupled to said generating means for combining said laser light beam to form a single laser beam and for directing said single laser beam onto solder on said electronic circuit to reflow said solder and provide a solder connection.

2. An apparatus for directing laser light to provide laser solder on an electronic circuit, said apparatus comprising:
    means for generating a plurality of laser light beams; and
    means optically coupled to said generating means for combining said laser light beams to form a single laser beam and for directing said single laser beam onto solder on said electronic circuit to reflow said solder and provide a solder connection wherein said combining means comprises a plurality of fiber optic cables being bundled together at one end adjacent said circuit.

3. An apparatus for directing laser light to provide laser solder on an electronic circuit, said apparatus comprising:
    means for generating a plurality of laser light beams;
    means optically coupled to said generating means for combining said laser light beams to form a single laser beam and for directing said single laser beam onto solder on said electronic circuit to reflow said solder and provide a solder connection; and
    means for focusing said laser light from said generating means into said combining means.

4. An apparatus for reflowing solder contacting an integrated circuit lead to connect the integrated circuit lead to a printed circuit board, said apparatus comprising:
    means for generating a plurality of laser light beams;
    a plurality of fiber optic cables having an input end and an output end, said input end being optically coupled to said generating means to allow light from said generating means to propagate through said cables and said output end being bundled together;
    homogonizer means optically coupled to said output end for combining said propagated light, within said fiber optic cables, so as to form a single laser light beam; and
    means for directing said single laser light beam from said homogonizer means onto the integrated circuit lead so as to heat said lead, thereby reflowing said solder.

5. The apparatus as recited in claim 4 wherein said generating means has a plurality of laser diodes.

6. The apparatus as recited in claim 4 further comprising means for focusing laser light from said generating means into said fiber optic cable.

7. The apparatus as recited in claim 4 further comprising:
    means for enabling and disabling said generating means; and
    means for moving said circuit board so that said combined laser light beam can reflow another solder location on said printed circuit board.

8. An apparatus for melting solder contacting an integrated circuit lead to connect the integrated circuit lead to a printed circuit board, said apparatus comprising:
- a plurality of laser diodes generating laser light;
- a plurality of fiber optic cables, each fiber cable having one end optically coupled to said laser diode, and the opposite end bundled together with the other fiber cables such that the output from said bundle forms a plurality of closely spaced light beams; and
- homogonizer means connected to said bundled end of said fiber optic cables for combining said plurality of light beams to form a single laser beam; and
- means for focusing said single laser beam on said integrated circuit lead so as to heat said lead, thereby melting said solder.

9. The apparatus as recited in claim 8 further comprising:
- means for enabling and disabling said laser light beams; and
- means for moving said circuit board so that said focused beam can heat another integrated circuit lead location.

10. The apparatus as recited in claim 8 further comprising means for setting the duration that said laser diode is turned on to a time period between 0.75 and 1.25 seconds.

11. A system for melting solder contacting an integrated circuit lead to connect the integrated circuit lead to a printed circuit board comprising:
- means for generating a plurality of focused laser beams to simultaneously melt solder located at a plurality of locations on said circuit board, said generating means comprising:
  (a) a plurality of laser diodes generating laser light;
  (b) a plurality of fiber optic cables, each fiber optic cable having one end optically coupled to said laser diode so as to propagate the light through said cables and the opposite end of said fiber cables being bundled together with the other fiber optic cables;
  (c) means for combining the light output from said plurality of fiber optic cables to form a single laser light beam;
  (d) means for focusing said single laser light beam on said integrated circuit lead so as to heat said lead, thereby reflowing solder; and
- means for moving said circuit board so that said focused beams can heat another lead location on said circuit board.

12. The apparatus as recited in claim 11 wherein said soldering locations on an integrated circuit lead are located between 0.010 and 0.500 inches apart.

13. A method of heating a material comprising the steps of:
- generating a plurality of laser light beams from a plurality of diode lasers;
- optically coupling said plurality of laser light beams into a fiber optic cable;
- forming a single laser light beam from the light output of said fiber optic cable; and
- focusing the formed laser light beam on said material so as to heat said material.

14. The method of soldering an electronic chip lead having solder under the lead on a printed circuit board substrate, comprising the steps of:
- generating a laser light beam from a diode laser;
- optically coupling said laser light beam into a fiber optic cable;
- forming a laser light beam from the light output of said fiber optic cable; and
- focusing the formed laser light beam on said electronic chip lead so as to heat said lead, thereby melting solder;
- enabling and disabling said light beam; and
- moving said electronic chip so that said focused laser beam can heat another electronic chip lead location.

15. The method of soldering an electronic chip lead having solder under the lead on a printed circuit board substrate, comprising the steps of:
- generating a laser light beam from a diode laser;
- optically coupling said laser light beam into a fiber optic cable;
- forming a laser light beam from the light output of said fiber optic cable;
- focusing the formed laser light beam on said electronic chip lead so as to heat said lead, thereby melting solder; and
- setting the duration that said light beam is enabled to a time between 0.75 and 1.25 seconds.

* * * * *